United States Patent
Kushida et al.

(10) Patent No.: US 8,614,445 B2
(45) Date of Patent: Dec. 24, 2013

(54) ALKYLSILANE LAMINATE, PRODUCTION METHOD THEREOF AND THIN-FILM TRANSISTOR

(75) Inventors: Takashi Kushida, Hino (JP); Hiroyoshi Naito, Sakai (JP)

(73) Assignee: Teijin Limited, Osaka (JP)

( * ) Notice: Subject to any disclaimer, the term of this patent is extended or adjusted under 35 U.S.C. 154(b) by 71 days.

(21) Appl. No.: 13/322,830

(22) PCT Filed: May 27, 2010

(86) PCT No.: PCT/JP2010/059032
§ 371 (c)(1),
(2), (4) Date: Nov. 28, 2011

(87) PCT Pub. No.: WO2010/137664
PCT Pub. Date: Dec. 2, 2010

(65) Prior Publication Data
US 2012/0080679 A1      Apr. 5, 2012

(30) Foreign Application Priority Data

May 28, 2009 (JP) ................................. 2009-129173
May 28, 2009 (JP) ................................. 2009-129190

(51) Int. Cl.
*H01L 29/04*   (2006.01)

(52) U.S. Cl.
USPC ........ 257/57; 257/66; 257/E29.273; 428/447; 428/336; 428/141

(58) Field of Classification Search
USPC ....... 257/57, 66, E29.273; 438/447, 336, 141
See application file for complete search history.

(56) References Cited

U.S. PATENT DOCUMENTS

| | | |
|---|---|---|
| 6,284,197 B1 | 9/2001 | Abbott et al. |
| 6,828,582 B1 | 12/2004 | Ando et al. |
| 2003/0059984 A1 | 3/2003 | Sirringhaus et al. |
| 2006/0160276 A1 | 7/2006 | Brown et al. |
| 2007/0105396 A1 | 5/2007 | Li et al. |
| 2007/0178710 A1 | 8/2007 | Muyres et al. |
| 2009/0298296 A1 | 12/2009 | Burdinski |
| 2010/0244000 A1 | 9/2010 | Tanaka et al. |

FOREIGN PATENT DOCUMENTS

| | | |
|---|---|---|
| JP | 2002-517718 A | 6/2002 |
| JP | 2005-079560 A | 3/2005 |
| JP | 2006-510210 A | 3/2006 |

(Continued)

OTHER PUBLICATIONS

Jeon, Noo Li, et al., "Structure and Stability of Patterned Self-Assembled Films of Octadecyltrichlorosilane Formed by Contact Printing," Langmuir, 1997, pp. 3382-3391, vol. 13.

(Continued)

*Primary Examiner* — Eugene Lee
*Assistant Examiner* — Elias Ullah
(74) *Attorney, Agent, or Firm* — Sughrue Mion, PLLC (57) ABSTRACT

Provided is an alkylsilane laminate with which it is possible to obtain an organic semiconductor film having excellent semiconductor properties. Such a laminate can be useful for an organic thin-film transistor. The alkylsilane laminate comprises an underlayer (Sub) having hydroxyl groups at the surface and an alkylsilane thin film (AS) formed on this underlayer. The alkylsilane laminate is a laminate wherein the critical surface energy Ec of the alkylsilane thin film and the number of carbons (X) of the alkylsilane satisfies the following formula (1): $Ec \leq 29.00 - 0.63x$ (mN/m) (1) Also provided is a thin-film transistor (10) having such an alkylsilane laminate (Sub, AS).

10 Claims, 3 Drawing Sheets

(56) References Cited

FOREIGN PATENT DOCUMENTS

| | | |
|---|---|---|
| JP | 2007-129227 A | 5/2007 |
| JP | 2007-512680 A | 5/2007 |
| JP | 2008-7365 A | 1/2008 |
| JP | 2008-171978 A | 7/2008 |
| JP | 2008-192724 A | 8/2008 |
| JP | 2008-529807 A | 8/2008 |
| JP | 2009-059751 A | 3/2009 |
| WO | 2004/055920 A2 | 7/2004 |

OTHER PUBLICATIONS

Lin, Y.Y., et al., "Stacked Pentacene Layer Organic Thin-Film Transistors with Improved Characteristics," IEEE Electron Devices Letters, Dec. 1997, pp. 606-608, vol. 18, No. 12.

Onclin, Steffen, et al., "Engineering Silicon Oxide Surfaces Using Self-Assembled Monolayers," Angewandte Chemie International Edition, 2005, pp. 6282-6304, vol. 44.

Salleo, A., et al., "Polymer thin-film transistors with chemically modified dielectric interfaces," Applied Physics Letters, Dec. 2002, pp. 4383-4385, vol. 81, No. 23.

Sirringhaus, H., et al., "Two-dimensional charge transport in self-organized, high-mobility conjugated polymers," Letters to Nature, Oct. 1999, pp. 4509-4521, vol. 401.

Wang, Yuliang, et al., "Growth of Ultrasmooth Octadecyltrichlorosilane Self-Assembled Monolayers on $SiO_2$," Langmuir, 2003, pp. 1159-1167, vol. 19, No. 4.

Extended European Search Report for Application No. 10780618.4 dated May 14, 2013.

Kushida et al.; Field-effect transistor characteristics and microstructure of regioregular poly(3-hexylthiophene) on alkylsilane self-assembled monolayers prepared by microcontact printing; Organic Electronics, Elsevier, Amsterdam, NL, vol. 11, No. 7, Apr. 18, 2010, pp. 1323-1326.

ALKYLSILANE LAMINATE, PRODUCTION METHOD THEREOF AND THIN-FILM TRANSISTOR

CROSS REFERENCE TO RELATED APPLICATION

This application is a National Stage of International Application No. PCT/JP2010/059032, filed on May 27, 2010, the contents of which are incorporated herein by reference in their entirety.

TECHNICAL FIELD

The present invention relates to an alkylsilane laminate and a production method thereof. The present invention also relates to a thin-film transistor, particularly, a thin-film transistor having an organic semiconductor film.

BACKGROUND ART

In recent years, a semiconductor device typified by a thin-film transistor (TFT) has been used for various applications such as liquid crystal, other display devices or solar cell panels. The semiconductor device predominantly used at present, and in particularly a semiconductor device using silicon as a semiconductor material, suffers from high production cost, because a vacuum process such as CVD and sputtering is employed when manufacturing. Also, in view of the process temperature, it is difficult to produce such a semiconductor device as a flexible device formed on a polymer film or the like.

In the field requiring low cost, such as in the field of lightweight flexible device and RF-ID (Radio Frequency Identification) which are expected to be used in the future, studies are being made to apply an organic semiconductor device manufacturable by a simple and easy method to an active device. The vacuum deposition apparatus or coating apparatus used in the manufacture of such an organic semiconductor device is inexpensive compared with the CVD apparatus or sputtering apparatus used in the manufacture of an inorganic semiconductor. Furthermore, in the manufacture of an organic semiconductor device, the process temperature is low, and therefore it is also possible to form the organic semiconductor device on a polymer film, paper or the like.

A thin-film transistor using an organic semiconductor has, on a substrate, a source electrode, a drain electrode, a gate electrode, a gate insulating film and an organic semiconductor film. In such a thin-film transistor, the source electrode and the drain electrode are insulated from the gate electrode by the gate insulating film, and thereby the current flowing from the source electrode to the drain electrode through the organic semiconductor is controlled by the voltage applied to the gate electrode.

The organic semiconductor film is an aggregate of a low molecular compound or a polymer compound. As the organic semiconductor material of a low molecular type, for example, an acene-based compound (a condensed polycyclic compound where rings are linearly fused) such as pentacene and thiophene oligomer is known. Also, as the organic semiconductor material of a polymer type, a regioregular polyalkylthiophene (P3AT) and a poly(fluorenebithiophene) (F8T2) are known.

In order to obtain high switching characteristics in an organic thin-film transistor, the charge mobility of the organic semiconductor film must be enhanced. As the method for enhancing the charge mobility of the organic semiconductor film, highly aligning organic semiconductor molecules forming the organic semiconductor film is commonly carried out. For the formation of a highly-aligned organic semiconductor film, it is known to surface-treat the substrate or gate insulating film, on which the organic semiconductor film is deposited, and particularly to cover the gate insulating film surface, on which the organic semiconductor film is deposited, with a Self-Assembled Monolayer (SAM) (Patent Documents 1 and 2 and Non-Patent Documents 1 to 3).

As the substrate or gate insulating film, on which the organic semiconductor film is deposited, a silicon oxide thin film can be used. As the SAM covering the substrate or gate insulating film an organosilane monolayer, for example an alkylsilane monolayer, can be used.

When an organic semiconductor is formed on a substrate or gate insulating film previously surface-modified with SAM, the charge mobility of the organic semiconductor film is enhanced. According to this technique, an organic TFT having charge mobility surpassing that of the existing TFT composed of amorphous silicone has been also reported.

In this connection, various techniques for reforming a substrate surface having OH groups such as silica surface with SAM such as organosilane layer (silane coupling agent layer) are known (Non-Patent Document 4). Known representative forming methods include a solution method of performing a silane coupling reaction between OH groups on the substrate and organosilane in a solution, and a vapor phase method of performing the reaction in a vapor phase by using an organosilane vapor. Regarding the solution method, it is known that SAM having high flatness is obtained by performing the silane coupling reaction in a solution with a low water content (Non-Patent Document 5).

Also, it is known to form an organosilane thin film by using a microcontact printing method (Non-Patent Document 6). In this case, a patterned organosilane thin film may also be formed by coating organosilane as a coupling agent on a patterned stamp, and transferring the coupling agent onto a substrate.

RELATED ART

Patent Document

Patent Document 1: Japanese Unexamined Patent Publication No. 2005-79560

Patent Document 2: Japanese Unexamined Patent Publication No. 2009-59751

Non-Patent Document

Non-Patent Document 1: H. Sirringhaus et al., Nature, Vol. 40, pp. 4509-4521, 1999

Non-Patent Document 2: A. Salleo et al., Applied Physics Letters, Vol. 81, No. 23, pp. 4383-4385, 2002

Non-Patent Document 3: Y. Y. Lin et al., IEEE Trans Electron Devices, Vol. 44, pp. 1325-1331, 1997

Non-Patent Document 4: S. Onclin et al., Angewandte Chemie International Edition, Vol. 44, pp. 6282-6304, 2005

Non-Patent Document 5: Y. Wang et al., Langmuir, Vol. 19, pp. 1159-1167, 2003

Non-Patent Document 6: N. L. Jeon et al., Langmuir, Vol. 13, pp. 3382-3391, 1997

SUMMARY OF THE INVENTION

Problems to be Solved by the Invention

As described above, forming an organic semiconductor film on a self-assembled monolayer (SAM) so as to highly align organic semiconductor molecules constituting an organic semiconductor film, and thereby enhance the charge mobility of the organic semiconductor film, and at the same time, increase the switching speed and the on/off ratio of current is commonly carried out. Despite such improvements, it is still demanded to further improve the characteristics of the organic semiconductor.

An object of the present invention is to provide an alkylsilane laminate, which can provide an organic semiconductor film having excellent semiconductor characteristics. Such a laminate can be usefully used for an organic thin-film transistor. Another object of the present invention is to provide a method for easily producing such an alkylsilane laminate.

Means to Solve the Problems

The present inventors have found that SAM of alkylsilane obtained by a contact printing method in a controlled atmosphere can solve those problems, and thereby accomplished the present invention described below.

<1> An alkylsilane laminate, comprising an underlayer having hydroxyl groups on the surface thereby and an alkylsilane thin film formed on the underlayer, wherein the critical surface energy Ec of the alkylsilane thin film and the carbon number x of the alkylsilane satisfy the following formula (1):

$$Ec \leq 29.00 - 0.63x \text{ (mN/m)} \tag{1}$$

<2> The laminate as described in <1> above, wherein the average thickness of the alkylsilane thin film is 10 nm or less.

<3> The laminate as described in <1> or <2> above, wherein the roughness Ra of the alkylsilane thin film is 1 nm or less.

<4> The laminate as described in any one of <1> to <3> above, wherein the alkylsilane thin film contains a siloxane oligomer.

<5> The laminate as described in any one of <1> to <4> above, wherein the alkylsilane is a linear alkylsilane.

<6> The laminate as described in any one of <1> to <5> above, wherein the alkylsilane thin film is made of a trichloroalkylsilane or a trialkoxyalkylsilane as a raw material.

<7> The laminate as described in any one of <1> to <6> above, wherein the hydroxyl group-containing surface of the underlayer is provided by silica.

<8> The laminate as described in any one of <1> to <7> above, wherein the hydroxyl group-containing surface of the underlayer is provided by a silica layer stacked on a polymer substrate.

<9> The laminate as described in any one of <1> to <8> above, wherein the carbon number of the alkylsilane is 10 or more.

<10> A method for producing the laminate described in any one of <1> to <9> above, comprising forming the alkylsilane thin film on the underlayer by a contact printing method in an atmosphere with a humidity of 5% or less.

<11> A thin-film transistor, having, on one surface of a substrate, a source electrode, a drain electrode, a gate electrode, a gate insulating film and an organic semiconductor film, the source electrode and the drain electrode being insulated from the gate electrode by the gate insulating film, and the current flowing from the source electrode to the drain electrode through the organic semiconductor being controlled by the voltage applied to the gate electrode, wherein the thin-film transistor further has an alkylsilane thin film, the substrate or gate insulating film has hydroxyl groups on the surface thereof, the alkylsilane thin film is formed on the substrate or gate insulating film having hydroxyl groups on the surface thereof, and the critical surface energy Ec of the alkylsilane thin film and the carbon number x of the alkylsilane satisfy the following formula (1):

$$Ec \leq 29.00 - 0.63x \text{ (mN/m)} \tag{1}$$

Effects of the Invention

According to the alkylsilane laminate of the present invention, when an organic semiconductor film is formed thereon, the organic semiconductor film can have excellent semiconductor characteristics, for example, rise characteristics. Also, according to the method of the present invention for producing an alkylsilane laminate, the alkylsilane laminate of the present invention can be obtained, and particularly the alkylsilane laminate of the present invention can be obtained in a short period of time.

MODE FOR CARRYING OUT THE INVENTION

The alkylsilane laminate of the present invention having an underlayer and an alkylsilane thin film formed on the underlayer is described in detail below by referring to a thin-film transistor. However, the use of the alkylsilane laminate of the present invention is not limited to the following embodiments.

<<Thin-Film Transistor>>

The thin-film transistor of the present invention has, on one surface of a substrate, a source electrode, a drain electrode, a gate electrode, a gate insulating film and an organic semiconductor film; the source electrode and the drain electrode are insulated from the gate electrode by the gate insulating film; and the current flowing from the source electrode to the drain electrode through the organic semiconductor is controlled by the voltage applied to the gate electrode.

The thin-film transistor of the present invention can have any structure wherein the current flowing from the source electrode to the drain electrode through the organic semiconductor can be controlled by the voltage applied to the gate electrode. Accordingly, for example, the thin-film transistor of the present invention may have structures shown in FIGS. 1 to 5.

Figure 1:
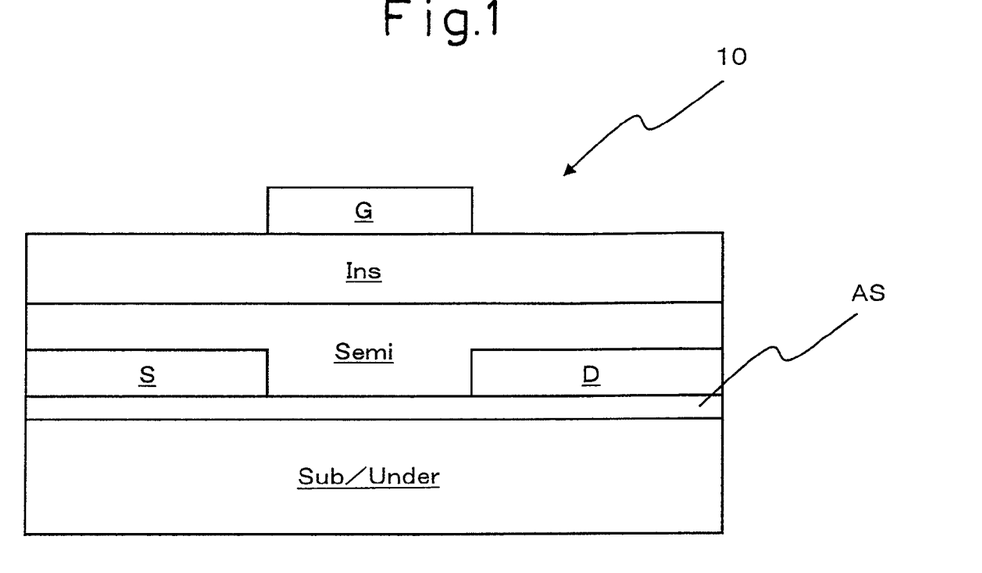
FIG. 1 is a view illustrating a first example of the thin-film transistor of the present invention.
Figure 2:
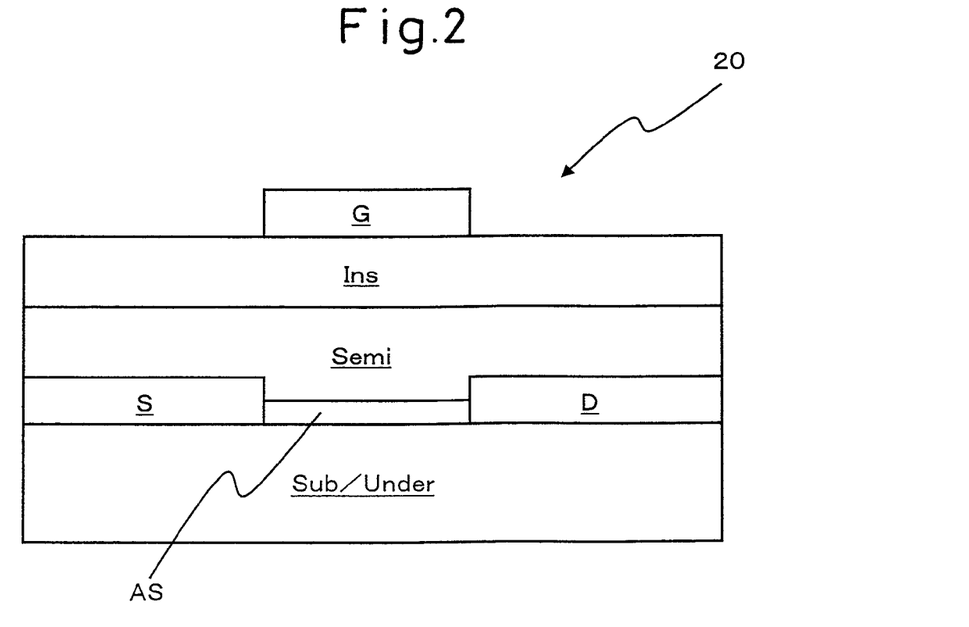
FIG. 2 is a view illustrating a second example of the thin-film transistor of the present invention.
Figure 3:
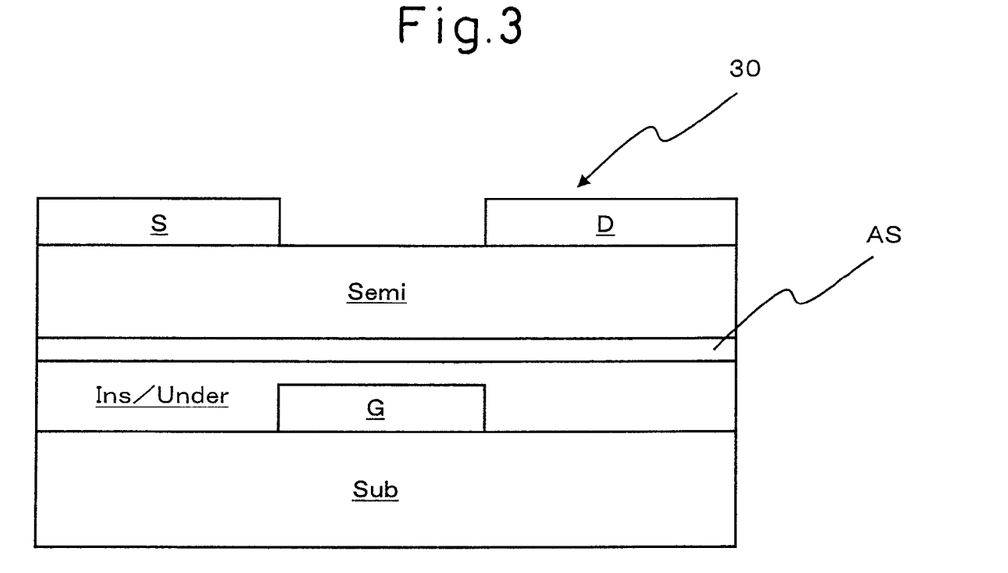
FIG. 3 is a view illustrating a third example of the thin-film transistor of the present invention.
Figure 4:
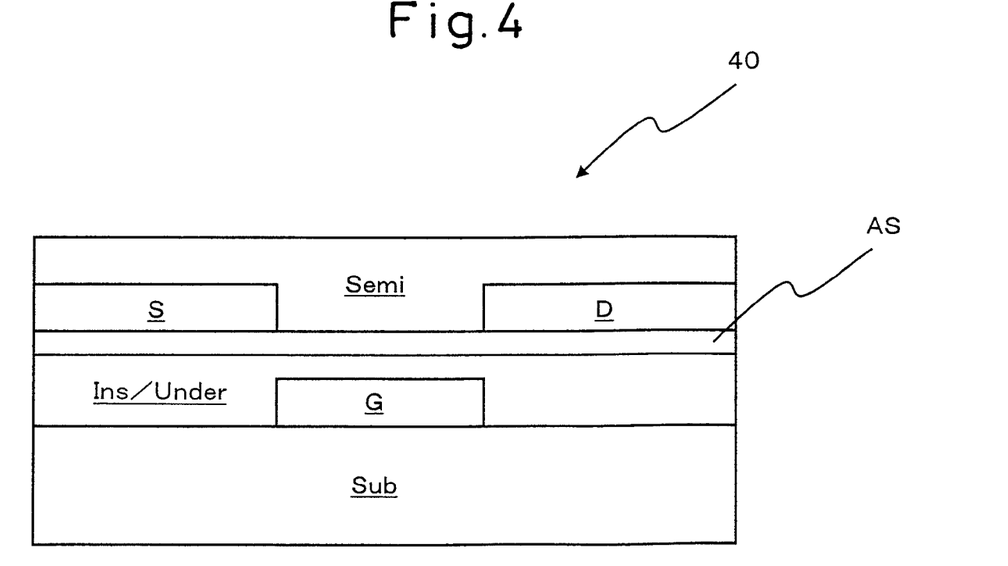
FIG. 4 is a view illustrating a fourth example of the thin-film transistor of the present invention.
Figure 5:
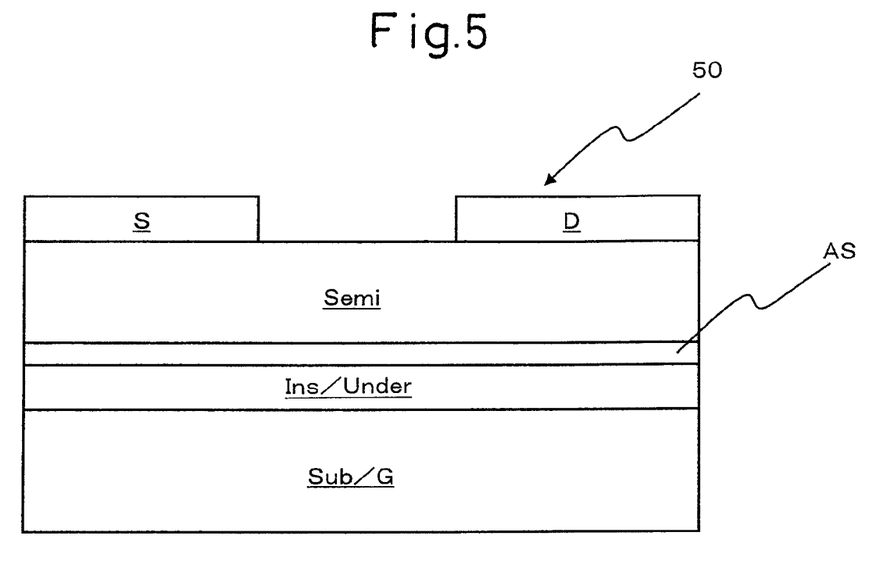
FIG. 5 is a view illustrating a fifth example of the thin-film transistor of the present invention.

In the embodiment shown in FIG. 1, an alkylsilane thin film (AS) is formed on a substrate (Sub) as the underlayer (Under); a source electrode (S), a gate electrode (G) and an organic semiconductor film (Semi) are formed thereon; a gate insulating film (Ins) is formed on the organic semiconductor film (Semi), and further a gate electrode (G) is formed on the gate insulating film (Ins). As shown in FIG. 5, the substrate (Sub) may serve also as the gate electrode (G).

In the thin-film transistor of the present invention, the substrate or gate insulating film has hydroxyl groups on the surface thereof; the thin-film transistor further has an alkylsilane thin film; the alkylsilane thin film is formed directly on the substrate or gate insulating film having hydroxyl groups on the surface thereof; and the organic semiconductor film is formed directly on the alkylsilane thin film. That is, according to the thin-film transistor of the present invention, the underlayer (Under) is used as the substrate (Sub) or gate insulating film (Ins) of the thin-film transistor, and the organic semiconductor film (Semi) is formed directly on the alkylsilane thin film (AS) formed on the underlayer (Under).

As for the general configuration of the thin-film transistor of the present invention, Patent Documents 1 and 2 and the like may be referred to, but in the following, each part of the thin-film transistor of the present invention is described in more detail.

<Thin-Film Transistor/Substrate>

The substrate of the thin-film transistor of the present invention may be made of any material capable of forming a thin-film transistor by stacking, on one surface thereof, a source electrode, a drain electrode, a gate electrode, a gate insulating film, an organic semiconductor film and an alkylsilane thin film. Accordingly, examples of the substrate include an inorganic material substrate such as a silica substrate, a glass substrate, a quartz substrate, an alumina substrate, a titania substrate and a silicon substrate; a metal substrate; and a resin substrate. Incidentally, in the case where the substrate is made of an electrically conductive material, the substrate can be designed to also serve as the gate electrode.

In the thin-film transistor of the present invention, the substrate or gate insulating film has hydroxyl groups on the surface thereof, and the substrate or gate insulating film having hydroxyl groups on the surface thereof is used as an underlayer for the alkylsilane thin film. Accordingly, in the case of using the substrate of the thin-film transistor as the underlayer for the alkylsilane thin film, the substrate must have hydroxyl groups on the surface thereof when stacking the alkylsilane thin film thereon. In this case, examples of the substrate include a silica substrate, a glass substrate, a quartz substrate, an alumina substrate, a titania substrate, a silicon substrate having a thermal oxide film or a natural oxide film, and a resin substrate having a silica surface layer. Furthermore, as the substrate in this case, for example, a resin substrate coated with a resin layer having hydroxyl groups on the surface thereof, and a resin substrate previously having hydroxyl groups on the surface thereof may be also used.

Incidentally, the substrate of the thin-film transistor may have any thickness according to use.

<Thin-Film Transistor/Insulating Film>

The gate insulating film of the thin-film transistor of the present invention can be made of any material having insulating properties sufficiently high to insulate the source electrode and the drain electrode from the gate electrode. Accordingly, the gate insulating film can be made of, for example, a resin or a metal oxide, and particularly silica, glass, alumina or titania.

As described above, in the thin-film transistor of the present invention, the substrate or gate insulating film has hydroxyl groups on the surface thereof, and the substrate or gate insulating film having hydroxyl groups on the surface thereof is used as the underlayer for the alkylsilane thin film. Accordingly, in the case of using the gate insulating film as the underlayer for the alkylsilane thin film, the gate insulating film must have hydroxyl groups on the surface thereof when stacking the alkylsilane thin film thereon. In this case, a film of a metal oxide, particularly silica, glass, alumina, titania or the like, can be used as the gate insulating film.

Incidentally, the thickness of the gate insulating film may be any thickness necessary to obtain a thin-film transistor.

<Thin-Film Transistor/Alkylsilane Thin Film>

The thin-film transistor of the present invention has an alkylsilane thin film formed on the substrate or gate insulating film serving as the underlayer having hydroxyl groups on the surface thereof. The alkylsilane thin film is combined with the hydroxyl groups of the underlayer through a silane coupling reaction.

According to the thin-film transistor of the present invention, the critical surface energy of the alkylsilane thin film, i.e., the critical surface energy on the surface of the alkylsilane thin film, which is opposite the underlayer, satisfies the following formula (1), particularly formula (2), more particularly (3), still more particularly formula (4):

$$Ec \leq 29.00 - 0.63x \text{ (mN/m)} \tag{1}$$

$$Ec \leq 28.00 - 0.63x \text{ (mN/m)} \tag{2}$$

$$Ec \leq 27.00 - 0.63x \text{ (mN/m)} \tag{3}$$

$$Ec \leq 26.00 - 0.63x \text{ (mN/m)} \tag{4}$$

(wherein Ec is the critical surface energy determined by extrapolation using a Zisman plot, and x is the number of carbons contained in the alkylsilane).

On the other hand, the critical surface energy of the conventionally reported alkylsilane film substantially satisfies the relationship of formula (A):

$$Ec = 30.50 - 0.63x \tag{A}$$

(wherein Ec is the critical surface energy determined by extrapolation using a Zisman plot, and x is the number of carbons contained in the alkylsilane).

Incidentally, the critical surface energy value as used in the present invention is a value obtained by a Zisman plot wherein the contact angle is measured by using several kinds of wetting index standard solutions (JIS K 6768).

That is, the alkylsilane thin film of the thin-film transistor of the present invention has a small critical surface energy in comparison with the conventional alkylsilane thin film wherein the number of carbons contained in the alkylsilane is the same. The critical surface energy of the alkylsilane thin film depends on the functional group in the outermost layer and the density thereof. Accordingly, it is considered that, in the alkylsilane thin film of the thin-film transistor of the present invention, the film density is high, and thereby the density of the $CH_3$ groups present on the surface is high in comparison with the conventional alkylsilane thin film wherein the number of carbons contained in the alkylsilane is the same.

The average thickness of the alkylsilane thin film may be 10 nm or less, 7 nm or less, 5 nm or less, or 3 nm or less. Particularly, the thickness may be a thickness ensuring that the alkyl thin film is a monolayer.

The average thickness of the thin film used in the present invention is an optically measured thin film thickness, and particularly a thickness measured by irradiating a sample with light and using an ellipsometer capable of measuring the change in the polarizing state of light reflected by the sample.

The roughness Ra of the alkylsilane thin film may be 1.0 nm or less, or 0.7 nm or less, because if the roughness is extreme, the semiconductor characteristics of the organic semiconductor film formed on the alkylsilane thin film may deteriorate.

The arithmetic mean roughness (centerline average roughness) (Ra) as used in the present invention is the roughness defined in accordance with JIS B0601-1994. Specifically, the arithmetic mean roughness (Ra) is represented by the following formula, assuming that a portion having a reference length l is extracted from a roughness curve in its centerline direction, the centerline of the extracted portion is X-axis, the longitudinal magnification direction is Y-axis, and the roughness curve is expressed by y=f(x):

$$R_a = \frac{1}{l}\int_0^l |f(x)|dx \qquad \text{[Math. 1]}$$

The alkylsilane thin film preferably has no protrusion having a height of 30 nm or more, 10 nm or more, 5 nm or more, or 3 nm or more. This is because, if the alkylsilane thin film has excessively large protrusions, the semiconductor characteristics of the organic semiconductor film formed on the alkylsilane thin film may deteriorate.

The alkylsilane for obtaining the alkylsilane thin film of the present invention is not particularly limited, and includes, for example, a linear alkylsilane and a branched alkylsilane, and particularly a linear alkylsilane. The carbon number of the alkylsilane may be 4 or more, 8 or more, or 10 or more, and 30 or less, 25 or less, and particularly may be from 12 to 22. If the carbon number of the alkylsilane is too small, the organic semiconductor film may have insufficient characteristics. Specific examples of the alkylsilane include a trihalogen alkylsilane such as trichloroalkylsilane, and a trialkoxyalkylsilane.

The alkylsilane thin film of the present invention can be formed on the substrate or gate insulating film serving as the underlayer having hydroxyl groups on the surface thereof, by a contact printing method in an atmosphere with a humidity of 5% or less, preferably 3% or less. If the humidity in the atmosphere wherein the contact printing method is performed is too high, the alkylsilane thin film of the present invention may not be obtained, and also protrusions may be produced on the surface of the alkylsilane thin film.

The material for the stamp used in the contact printing method is not particularly limited, and examples thereof include a silicone polymer such as polydimethylsiloxane. Also, the atmosphere in which the contact printing method is performed may be an inert atmosphere, particularly a nitrogen atmosphere.

In the contact printing method for obtaining the alkylsilane thin film of the present invention, a stamp coated with trichloroalkylsilane or trialkoxyalkylsilane itself, or a solution containing such an alkylsilane is contacted with the underlayer, and thereby the raw material compound is supplied from the stamp to form an alkylsilane thin film on the underlayer. In this case, the contact time for which the stamp is contacted with the underlayer varies depending on the condition, and, in general, is preferably 5 minutes or more.

In the case of obtaining the alkylsilane thin film of the present invention by contact printing method, the alkylsilane thin film of the present invention can be formed in a short time.

<Thin Film Transistor/Organic Semiconductor Film>>

The organic semiconductor film of the thin-film transistor of the present invention means a semiconductor film composed of an aggregate of organic semiconductor molecules, and includes, for example, a film of an organic semiconductor described in Patent Documents 1 and 2 and Non-Patent Documents 1 to 6, such as regioregular polyalkylthiophene (P3AT).

Accordingly, examples of the organic semiconductor molecule, which can be used in the thin-film transistor of the present invention, include a low molecular-type organic semiconductor molecule, such as acene-based compound (a condensed polycyclic compound where rings are linearly fused) including pentacene and thiophene oligomer; and a polymer-type organic semiconductor molecule, such as a regioregular polyalkylthiophene (P3AT) and a poly(fluorenebithiophene) (F8T2).

The organic semiconductor film of the thin-film transistor of the present invention may have any thickness which can fabricate a thin-film transistor, and may have a thickness of, for example, from 0.5 nm to 1 μm, or from 2 to 250 nm. Also, the organic semiconductor film can be obtained by any method such as molecular beam epitaxy method (MBE method), vacuum deposition method, chemical deposition method, and solution method. Among these, a solution method, that is, for example, a dipping method or a spin coating method, may be preferred in view of productivity and the like.

<Thin-Film Transistor/Electrode>

The source electrode, drain electrode and gate electrode of the thin-film transistor of the present invention may be made of any material having electrical conductivity high enough to be used as an electrode.

Accordingly, the electrode may be made of a metal such as gold, silver, copper, nickel, chromium and aluminum; an electrically conductive resin; an electrically conductive metal oxide; or the like. The thickness of the electrode can be determined based on the required electrical conductivity, softness, and the like.

<Thin-Film Transistor/Other Layer>

The thin-film transistor of the present invention may have any layers other than those in the above-described configuration, for example, may have a protective layer, particularly a protective layer formed on the organic semiconductor film. Such a protective layer can be formed, for example, of polyparaxylylene.

EXAMPLES

The present invention is described in greater detail below by referring to Examples and Comparative Examples, but the present invention is not limited thereto. The materials and evaluation methods used in Examples and Comparative Examples are as follows.

Silicon Substrate:

A n-type silicon wafer (plane orientation: <100>, specific resistance: from 1 to 10Ω) with a 300 nm-thick thermal oxide film was treated with hot concentrated sulfuric acid for 30 minutes, then ultrasonically washed several time in each of pure water, acetone, toluene and hexane, and further washed in an UV ozone washing apparatus for 30 minutes. The resulting wafer was used as the substrate.

Stamp Material:

Sylgard 184 produced by Dow Corning Toray Silicone Co., Ltd. was cured in a plate form to obtain a polydimethylsiloxane-made stamp material, and this material was used.

Thickness of Organic Thin Film:

The thickness of the organic thin film was measured at an incident angle of 70° by using an ellipsometer, M-150, manufactured by JASCO Corporation. The calculation was performed by setting the refractive index of the organic thin film to n=1.45.

Contact Angle:

The contact angle was measured with pure water by using a contact angle meter, Model CA-X, manufactured by Kyowa Interface Science Co., Ltd.

Critical Surface Energy:

The contact angle was measured by using wetting index standard solutions (JIS K6768) having a critical surface energy of 30 mN/m, 35 mN/m, 40 mN/m and 50 mN/m, and the critical surface energy was determined by a Zisman plot.

Surface Roughness and Protrusion:

The surface roughness and protrusion were measured in a 20 μm-square visual field by using SPA400-DMF (atomic force microscope: AFM) manufactured by SII NanoTechnology Inc.

Charge Mobility and Threshold Voltage (Vth):

The charge mobility of the organic semiconductor film and the threshold voltage (Vth) were evaluated by using a semiconductor evaluation apparatus, Model 4200-SCS, manufactured by Keithley.

Example 1

(Production of Alkylsilane Thin Film (Contact Printing Method in a Nitrogen Atmosphere Having a Humidity of 3% or Less)

A 20 mM hexane solution of octadecyltrichlorosilane (linear, number of carbon atoms: 18) was prepared. The stamp material was dipped in the obtained octadecyltrichlorosilane solution, and dried for 10 minutes in a nitrogen atmosphere.

The dried stamp was contacted with the silicon substrate, and held for 120 minutes. After removing the stamp, the substrate was washed with hexane and ethanol, and ultrasonically washed for 3 minutes in ethanol. All of the steps up to this washing were performed in a nitrogen atmosphere in a glove box wherein the humidity was controlled to be 3% or less.

Thereafter, the substrate was washed with pure water, and then heat-treated at 100° C. for 5 minutes to produce a substrate having an octadecylsilane thin film (i.e., an alkylsilane thin film).

(Production of Organic Semiconductor Film)

1 part by mass of regioregular poly(3-hexylthiophene) ("P3HT") (sold by Aldrich, produced by Plextronics Inc., MW=25,000 to 35,000, electronics grade) was dissolved in 99 parts by mass of toluene to obtain a solution for spin coating. Using this solution for spin coating, a P3HT film (that is, an organic semiconductor film) was spin-coated (1,800 rpm, 20 seconds) on the substrate having an alkylsilane thin film.

(Manufacture of Thin-Film Transistor)

Gold was vacuum-deposited on the obtained organic semiconductor film by a mask vapor deposition method to form a source electrode and a drain electrode (L/w=50 μm/1.5 mm), and obtain a thin-film transistor which used the silicon substrate as the gate electrode. That is, a thin-film transistor having a configuration shown in FIG. 5 was obtained.

(Evaluation)

Figure 6:
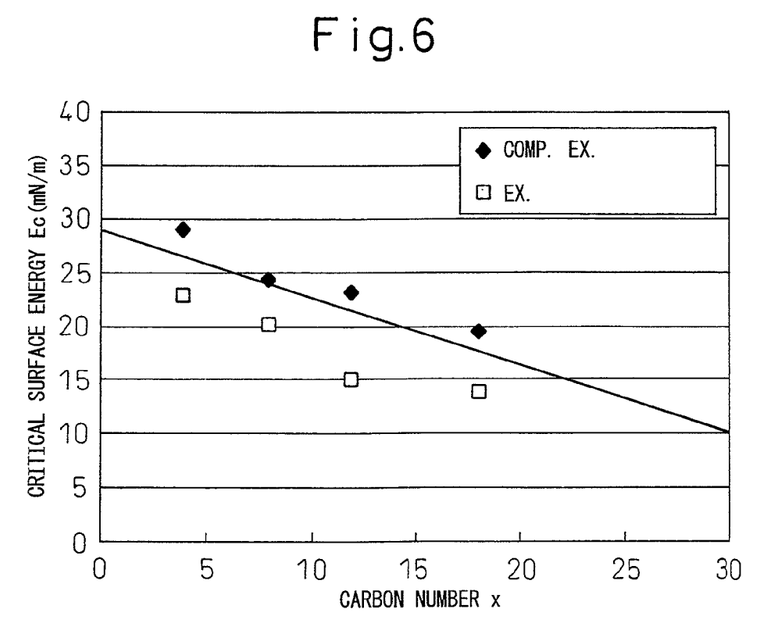
FIG. 6 is a view showing the relationship between the critical surface energy (Ec) of the alkylsilane thin film and the carbon number (x) of the alkyl chain, regarding Examples and Comparative Examples.

The evaluation results about the obtained alkylsilane thin film and thin-film transistor are shown in Table 1 and FIG. 6. FIG. 6 shows the relationship between the critical surface energy (Ec) of the alkylsilane thin film and the carbon number (x) of the alkyl chain. In FIG. 6, for reference, a straight line of Ec=29.00−0.63x (formula (1)) is shown together.

Example 2

This Example was performed in the same manner as Example 1, except that, in place of octadecyltrichlorosilane (linear, number of carbon atoms: 18), dodecyltrichlorosilane (linear, number of carbon atoms: 12) was used as the raw material of the alkylsilane thin film. The evaluation results about the obtained alkylsilane thin film and thin-film transistor are shown in Table 1 and FIG. 6.

Example 3

This Example was performed in the same manner as Example 1 except that, in place of octadecyltrichlorosilane (linear, number of carbon atoms: 18), octyltrichlorosilane (linear, number of carbon atoms: 8) was used as the raw material of the alkylsilane thin film. The evaluation results about the obtained alkylsilane thin film and thin-film transistor are shown in Table 1 and FIG. 6.

Example 4

This Example was performed in the same manner as Example 1 except that, in place of octadecyltrichlorosilane (linear, number of carbon atoms: 18), butyltrichlorosilane (linear, number of carbon atoms: 4) was used as the raw material of the alkylsilane thin film. The evaluation results about the obtained alkylsilane thin film and thin-film transistor are shown in Table 1 and FIG. 6.

Comparative Example 1

(Production of Alkylsilane Thin Film (Contact Printing Method in the Air)

In the same manner as in Example 1, a stamp dipped in the octadecyltrichlorosilane (linear, number of carbon atoms: 18) was dried for 10 minutes in a nitrogen atmosphere.

The dried stamp was contacted with the silicon substrate and held for 1 minute. After removing the stamp, the substrate was washed with hexane and ethanol, and ultrasonically washed for 30 minutes in ethanol. The step of contacting the stamp with the silicon substrate, and the subsequent washing step were performed in the air (humidity: about 60%).

Thereafter, the substrate was washed with pure water, and then heat-treated at 100° C. for 5 minutes to produce a substrate having an octadecylsilane thin film (i.e., an alkylsilane thin film). Using this alkylsilane thin film, a thin-film transistor was manufactured in the same manner as in Example 1.

The evaluation results about the obtained alkylsilane thin film and thin-film transistor are shown in Table 1 and FIG. 6.

Comparative Example 2

(Production of Alkylsilane Thin Film (Liquid Phase Method)

A 20 mM toluene solution of octadecyltrichlorosilane (linear, number of carbon atoms: 18) was prepared. The silicon substrate was dipped in the obtained octadecyltrichlorosilane solution, and held for 7 days. After the dipping, the substrate was washed with toluene and ethanol, and ultrasonically washed for 30 minutes in ethanol. All of the steps up to this washing were performed in a glove box wherein the humidity was controlled at 3% or less.

Thereafter, the substrate was washed with pure water, and then heat-treated at 100° C. for 5 minutes to produce an alkylsilane thin film. Using the obtained alkylsilane thin film, a thin-film transistor was manufactured in the same manner as in Example 1.

The evaluation results about the obtained thin-film transistor are shown in Table 1 and FIG. 6.

Comparative Example 3

In this Comparative Example, an alkylsilane film was obtained in the same manner as in Comparative Example 2 except that, in place of octadecyltrichlorosilane (linear, number of carbon atoms: 18), dodecyltrichlorosilane (linear, number of carbon atoms: 12) was used as the raw material of the alkylsilane thin film. Using the obtained alkylsilane thin film, a thin-film transistor was manufactured in the same manner as in Example 1.

The evaluation results about the obtained thin-film transistor are shown in Table 1 and FIG. 6.

Comparative Example 4

In this Comparative Example, an alkylsilane film was obtained in the same manner as in Comparative Example 2 except that, in place of octadecyltrichlorosilane (linear, number of carbon atoms: 18), octyltrichlorosilane (linear, number of carbon atoms: 8) was used as the raw material of the alkylsilane thin film. Using the obtained alkylsilane thin film, a thin-film transistor was manufactured in the same manner as in Example 1.

The evaluation results about the obtained thin-film transistor are shown in Table 1 and FIG. 6.

Comparative Example 5

In this Comparative Example, an alkylsilane film was obtained in the same manner as in Comparative Example 2 except that, in place of octadecyltrichlorosilane (linear, number of carbon atoms: 18), butyltrichlorosilane (number of carbon atoms: 4) was used as the raw material of the alkylsilane thin film. Using the obtained alkylsilane thin film, a thin-film transistor was manufactured in the same manner as in Example 1.

The evaluation results about the obtained thin-film transistor are shown in Table 1 and FIG. 6.

It is understood from Table 1 that the organic semiconductor films of Examples have excellent mobility and threshold voltage.

The invention claimed is:

1. A thin-film transistor, having, on one surface of a substrate, a source electrode, a drain electrode, a gate electrode, a gate insulating film and an organic semiconductor film, said source electrode and said drain electrode being insulated from said gate electrode by said gate insulating film, and the current flowing from said source electrode to said drain electrode through said organic semiconductor being controlled by the voltage applied to said gate electrode, wherein said thin-film transistor further has an alkylsilane thin film, said substrate or gate insulating film has hydroxyl groups on the surface thereof, said alkylsilane thin film is formed on said substrate or gate insulating film having hydroxyl groups on the surface thereof, and the critical surface energy Ec of said alkylsilane thin film and the carbon number x of the alkylsilane satisfy the following formula (1):

$$Ec \leq 29.00 - 0.63x \text{ (mN/m)} \quad (1);$$

wherein said alkylsilane thin film is made of a trichloroalkylsilane or a trialkoxyalkylsilane as a raw material.

2. The thin-film transistor according to claim 1, wherein the average thickness of said alkylsilane thin film is 10 nm or less.

3. The thin-film transistor according to claim 1, wherein the roughness Ra of said alkylsilane thin film is 1 nm or less.

4. The thin-film transistor according to claim 1, wherein said alkylsilane thin film contains a siloxane oligomer.

5. The thin-film transistor according to claim 1, wherein said alkylsilane is a linear alkylsilane.

6. The thin-film transistor according to claim 1, wherein the hydroxyl group-containing surface is provided by silica.

TABLE 1

| | | Raw Material | | Alkylsilane Thin Film | | | | | Thin-Film Transistor | |
| | | | | Critical Surface Energy (mN/m) | | | Surface | Protrusion | | |
| | Production Method | Name | Carbon Number (x) | Calculated (29.00 − 0.63x) | Measured | Thickness (nm) | Roughness (nm) | of 30 nm or more in Height | Mobility (cm²/Vs) | Threshold (V) |
|---|---|---|---|---|---|---|---|---|---|---|
| Example 1 | Contact Printing Method (humidity of 3% or less) | octadecyl-trichloro-silane | 18 | 17.66 | 13.7 | 2.8 | 0.47 | none | $3.0 \times 10^{-2}$ | −4.7 |
| Example 2 | Contact Printing Method (humidity of 3% or less) | dodecyl-trichloro-silane | 12 | 21.44 | 15.0 | 2.0 | 0.52 | none | $3.9 \times 10^{-2}$ | −6.5 |
| Example 3 | Contact Printing Method (humidity of 3% or less) | octyl-trichloro-silane | 8 | 23.96 | 20.1 | 1.8 | 0.56 | none | $3.4 \times 10^{-3}$ | −5.0 |
| Example 4 | Contact Printing Method (humidity of 3% or less) | butyl-trichloro-silane | 4 | 26.48 | 22.9 | 1.8 | 0.78 | none | $2.6 \times 10^{-3}$ | −0.7 |
| Comparative Example 1 | Contact Printing Method (in air) | octadecyl-trichloro-silane | 18 | 17.66 | 14.0 | 3.7 | 3.29 | present | $9.3 \times 10^{-3}$ | −10.0 |
| Comparative Example 2 | Liquid Phase Method (humidity of 3% or less) | octadecyl-trichloro-silane | 18 | 17.66 | 19.5 | 2.8 | 0.57 | — | $3.1 \times 10^{-2}$ | −12.7 |
| Comparative Example 3 | Liquid Phase Method (humidity of 3% or less) | dodecyl-trichloro-silane | 12 | 21.44 | 23.3 | 2.0 | 0.56 | — | $2.5 \times 10^{-2}$ | −12.4 |
| Comparative Example 4 | Liquid Phase Method (humidity of 3% or less) | octyl-trichloro-silane | 8 | 23.96 | 24.3 | 2.0 | 1.08 | — | $9.5 \times 10^{-4}$ | −6.3 |
| Comparative Example 5 | Liquid Phase Method (humidity of 3% or less) | butyl-trichloro-silane | 4 | 26.48 | 29.0 | 3.0 | 2.00 | — | $2.0 \times 10^{-4}$ | 29.0 |

7. The thin-film transistor according to claim 1, wherein the hydroxyl group-containing surface is provided by a silica layer stacked on a polymer substrate.

8. The thin-film transistor according to claim 1, wherein the carbon number of said alkylsilane is 10 or more.

9. A method for producing the thin-film transistor according to claim 1, comprising forming said alkylsilane thin film on said substrate or gate insulating film by a contact printing method in an atmosphere with a humidity of 5% or less.

10. The laminate thin-film transistor according to claim 2, wherein the roughness Ra of said alkylsilane thin film is 1 nm or less.

\* \* \* \* \*